(12) United States Patent
Sekine

(10) Patent No.: US 7,864,298 B2
(45) Date of Patent: Jan. 4, 2011

(54) STAGE APPARATUS AND EXPOSURE APPARATUS WITH HEATING-AND-COOLING UNIT TO CHANGE SHAPE OF MIRROR

(75) Inventor: Hirokazu Sekine, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 700 days.

(21) Appl. No.: 11/411,295

(22) Filed: Apr. 25, 2006

(65) Prior Publication Data

US 2006/0262308 A1 Nov. 23, 2006

(30) Foreign Application Priority Data

May 13, 2005 (JP) .............................. 2005-141030

(51) Int. Cl.
G03B 27/58 (2006.01)
G02B 7/182 (2006.01)
(52) U.S. Cl. ........................................ 355/72; 359/846
(58) Field of Classification Search .................. 355/72, 355/75, 53; 356/509; 359/845–848
See application file for complete search history.

(56) References Cited

U.S. PATENT DOCUMENTS

| 6,678,038 B2 * | 1/2004 | Binnard ........................ 355/72 |
| 2002/0109850 A1 | 8/2002 | Takai et al. |
| 2004/0051984 A1 * | 3/2004 | Oshino et al. ............... 359/845 |

FOREIGN PATENT DOCUMENTS

JP 2002-319541 A 10/2002

* cited by examiner

Primary Examiner—Peter B Kim
Assistant Examiner—Chia-how Michael Liu
(74) Attorney, Agent, or Firm—Canon U.S.A., Inc., IP Division

(57) ABSTRACT

At least one exemplary embodiment is directed to a stage apparatus which comprises a movable stage, a mirror for reflecting light from an interferometer to measure the position of the stage, a heating-and cooling unit for heating or cooling the mirror, and a calculator for calculating the shape of the mirror. The shape of the mirror can be changed by controlling the heating-and-cooling unit according to the shape of the mirror obtained from the calculator.

7 Claims, 7 Drawing Sheets

STAGE APPARATUS AND EXPOSURE APPARATUS WITH HEATING-AND-COOLING UNIT TO CHANGE SHAPE OF MIRROR

BACKGROUND OF THE INVENTION

1. Field of the Invention

The present invention relates to a stage apparatus for measuring the position with a laser interferometer and to an exposure apparatus using the stage apparatus.

2. Description of the Related Art

A laser interferometer is used in exposure apparatus for measuring the position of a reticle stage where a reticle (original plate) is mounted and a wafer stage where a wafer (substrate) is mounted.

As an example of measuring the position with a laser interferometer, JP-A No. 319541/2002 discusses that a mirror is installed on the stage and the measuring light from the laser interferometer installed outside of the stage is irradiated onto the mirror. Then, the measuring light reflected by the mirror and the reference light led through a predetermined distance are allowed to interfere with each other. The position of the stage is measured by detecting this interfering light with a detector.

As mentioned above, in the case when the laser interferometer is used for measuring the position of the stage, the surface machining accuracy of the mirror and the mounting accuracy of the mirror become factors for measurement errors. The accuracy especially demanded for the stage apparatus in the exposure apparatus increases more and more, and a method to further decrease such a measurement error has increased in recent years.

SUMMARY OF THE INVENTION

At least one exemplary embodiment is directed to a stage apparatus, including a movable stage, a mirror for reflecting the light from an interferometer to measure the position of the stage, a heating-and-cooling unit which heats or cools the mirror, and a calculator which calculates the shape of the mirror, where the shape of the mirror is changed by controlling the heating- and-cooling unit according to a shape of the mirror obtained by the calculator. Moreover, in at least one exemplary embodiment, the shape of the mirror can be changed to correct and/or reduce the measurement error caused by the differences between at least two exposure apparatuses.

A mirror shape correction method includes: a step for preparing a mirror having a reflecting surface formed along a first direction; a step for preparing a substrate having alignment marks formed along the first direction; a step for mounting the substrate on a stage of an exposure apparatus; a step for measuring the position of the stage by using the mirror; a step for detecting the alignment marks; a step for calculating a shape of the mirror based on the result of detecting the alignment marks; and a step for deforming the mirror utilizing the thermal deformation of the mirror based on the calculated shape.

Further features of the present invention will become apparent from the following description of exemplary embodiments (with reference to the attached drawings).

DESCRIPTION OF THE EMBODIMENTS

Figure 1:
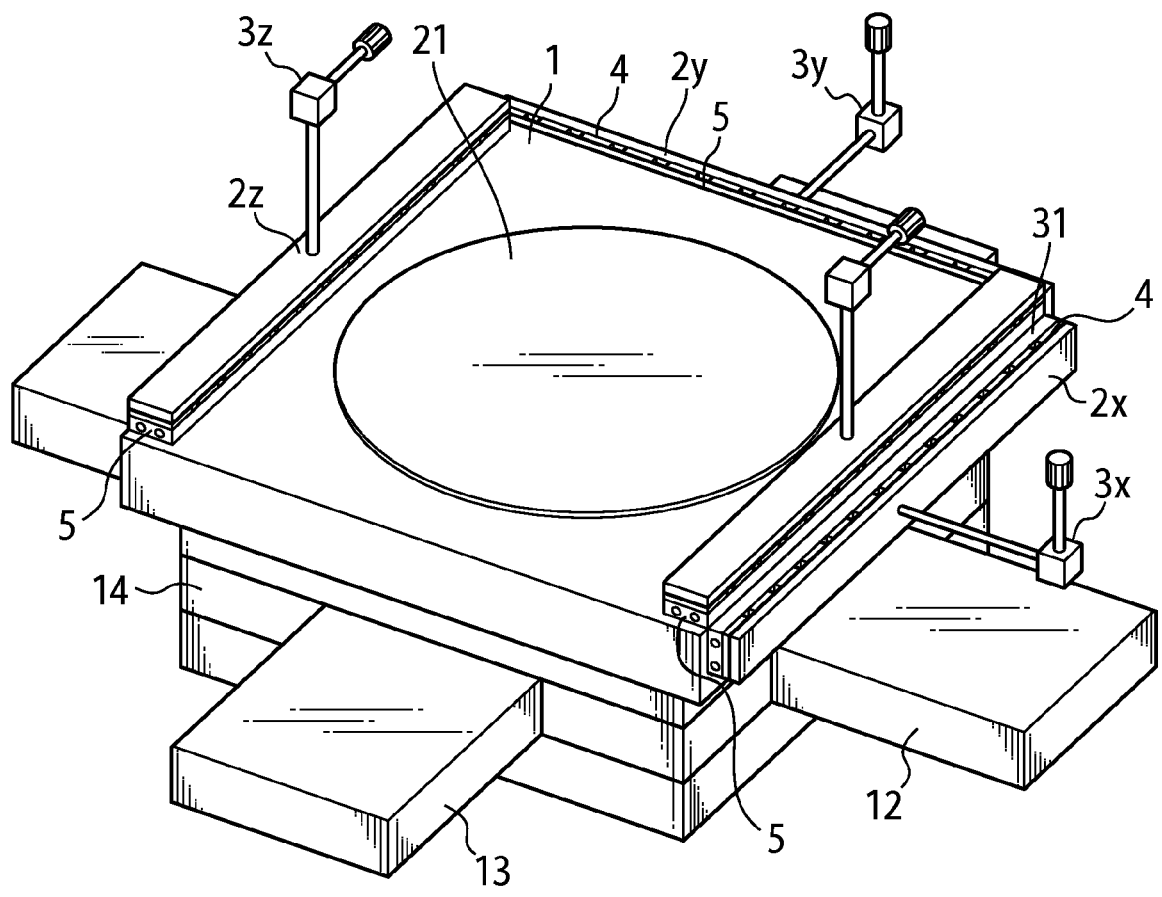
FIG. 1 is a perspective view illustrating an outline of a stage apparatus according to an exemplary embodiment of the present invention.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example resist processing.

In all of the examples illustrated and discussed herein any specific values should be interpreted to be illustrative only and non limiting. Thus, other examples of the exemplary embodiments could have different values.

Notice that similar reference numerals and letters refer to similar items in the following figures, and thus once an item is defined in one figure, it may not be discussed for following figures.

At least one exemplary embodiment of the present invention is now explained. The exemplary embodiments described below are examples of the present invention, and modifications or variations can be made in the configuration and in the various conditions of the apparatus to which the exemplary embodiments are applied.

Exemplary Embodiment 1

FIG. 1 is a schematic view illustrating a stage apparatus according to exemplary embodiment 1 of the present invention. In the following exemplary embodiment, although one example in which the stage apparatus can be applied to a wafer stage for mounting a wafer (substrate) in an exposure apparatus will be explained, it can be applied to a stage apparatus used for another application.

In FIG. 1, the stage apparatus 20 comprises a fine movement stage 1 on which a wafer chuck 21 is mounted, a coarse movement stage 14 on which the fine movement stage 1 is mounted, a beam 12 extending through the coarse movement stage 14 in the X direction, a beam 13 extending through the coarse movement stage 14 in the Y direction, a linear motor (not shown in the figure) which drives the beam 12 in the Y direction, a linear motor (not shown in the figure) which drives the beam 13 in the X direction. The wafer is held by the wafer chuck 21.

The beam 12 transfers the power in the Y direction to the coarse movement stage 14 and guides the coarse movement stage 14 when it moves in the X direction. The beam 13 transfers the power in the X direction to the coarse movement stage 14 and guides the coarse movement stage 14 when it moves in the Y direction. It is preferable that the coarse movement stage does not make contact with the beam, and for this purpose, a gas bearing or an electromagnetic coupling can be used.

A linear motor (not shown in the figure) can be used between the coarse movement stage 14 and the fine movement stage 1. The fine movement stage 1 can be driven in the Z direction relative to the coarse movement stage 14 by this linear motor. The linear motor can be provided as not only one which drives in the Z direction but also one which drives in the directions of X, Y, ωx (rotation direction about X axis), ωy (rotation direction about Y axis), and ωz (rotation direction about Z axis). The linear motor provided between the coarse movement stage and the fine movement stage can have a shorter stroke than the linear motor which drives the beams 12 and 13.

A coupling (not shown in the figure) which transfers the power from the coarse movement stage 14 to the fine movement stage 1 is provided between the coarse movement stage 14 and the fine movement stage 1. It is preferable that the coarse movement stage 14 does not make contact with the fine movement stage 1, and for this purpose, an electromagnetic coupling can be used.

Next, the measurement of the position of the stage will be explained. Mirrors 2X, 2Y, and 2Z are provided at the top face or the side faces of the fine movement stage 1. The mirror 2X has a reflecting face perpendicular to the X direction and it is provided along the Y direction. The mirror 2Y has a reflecting face perpendicular to the Y direction and it is provided along the X direction. The mirror 2Z has a reflecting face perpendicular to the Z direction. Theses mirrors can have been provided together with the fine movement stage.

Laser interferometers 3X, 3Y, and 3Z which irradiate the measuring light onto the above-mentioned mirrors can be arranged outside of the stage. The laser beam led from the light source which is not shown in the figure is split into the measuring light and the reference light by a splitter provided in the laser interferometer. The measuring light is irradiated onto and reflected by the mirror and the reflected light is facilitated to interfere with the reference light led through a predetermined distance. The positions of the stage top plate in the X direction, Y direction, and Z direction (actually the position of the mirror surfaces) are measured by detecting this interfering light by detectors which are not shown in the figure. The measured results are input to a controller which controls the linear motors and the position of the fine movement stage is feedback-controlled.

Figure 2:
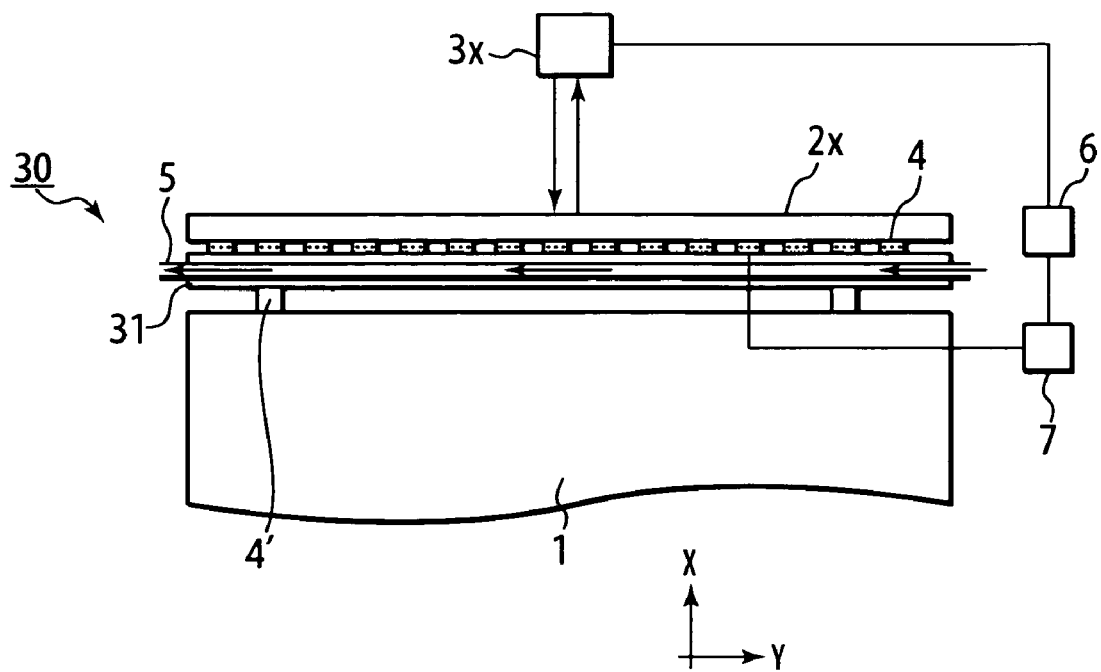
FIG. 2 is a schematic view illustrating a mirror shape control system in the stage apparatus shown in FIG. 1.

Hereafter, details in the neighborhood of the mirror will be described. FIG. 2 is a view illustrating the mirror 2X of FIG. 1 in an enlarged scale. Herein, the mirror 2X will be explained and it is noted that the mirrors 2Y and 2Z are related to the mirror 2X.

A temperature control system 30 is provided in the mirror 2X. The temperature control system 30 comprises a plurality of Peltier elements 4 arranged along the mirror, a member 31, which can have a flow channel 5 provided therein. Temperature controlled coolant is circulated in the flow channel 5 though the piping, which is not shown in the figure. The current energizing the Peltier elements 4 is controlled by a controller 7.

According to such a configuration, a minute temperature change is given to the mirror 2X by the heating or cooling action of the Peltier elements 4, and the mirror 2X is thermally deformed. That is, there is an attempt to correct (decrease) any deformation caused by a manufacturing error and a mounting error of the mirror, by heating and cooling the mirror by using the Peltier elements 4 and actively deforming the mirror.

Figure 4:
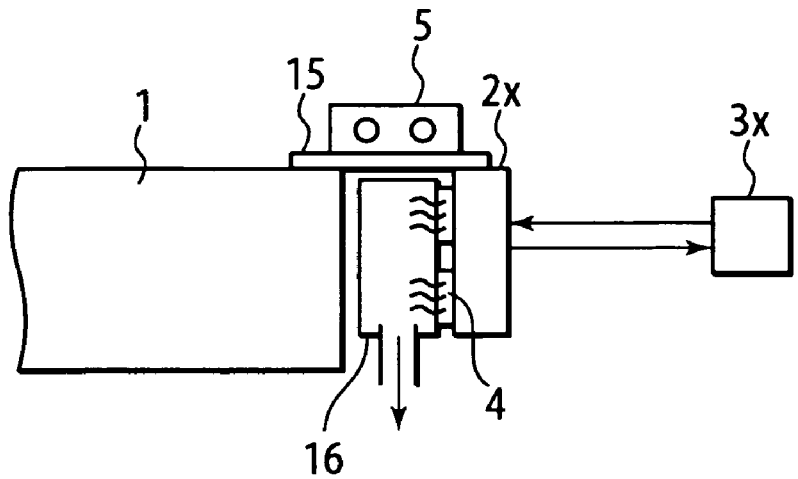
FIG. 4 is a view illustrating a method for exhausting the heat from a Peltier element.

Temperature detectors (not shown in the figure) are provided at the inflow part and the outflow part of the flow channel 5, and the temperature of the coolant flowing through the flow channel is controlled according to the detected results of these temperature detectors. Herein, the flow channel 5 plays a role to recover the quantity of heat released from the Peltier elements 4. Heat can be exhausted with gas by providing an exhaust route 16 as illustrated in FIG. 4.

Current energizing the Peltier elements 4 can be controlled based on the output of a mirror shape calculator 6. A method for calculating the shape of the mirror by the mirror shape calculator 6 is discussed in, for instance, JP-A No. 010748/1993. The shape of the mirror 2X can be calculated by irradiating the measuring light onto the mirror 2X and measuring the surface position while irradiating two of the measuring lights onto the mirror 2Y and moving the stage in the Y direction under a condition where the servo is put on the linear motor to avoid the rotation of the stage. It is similar regarding the mirror 2Y. With regards to the mirror 2Z, the shape of the mirror 2Z can be calculated by irradiating the measuring light onto the mirror 2Z, shifting the measuring light in the Z direction and moving the stage in the Y direction under a condition where the servo is put on the linear motor to avoid the rotation of the stage.

The controller 7 controls the current for energizing the Peltier elements 4 based on the shape of the mirror and can cause a predetermined current to flow to the Peltier elements 4. The relationship (correlation) between the current for energizing the Peltier elements 4 and the shape of the mirror is obtained in advance by experiments, simulations, and/or calculations and stored in a memory device.

In FIG. 2, although Peltier elements 4' are provided together with the Peltier elements 4, Peltier elements 4' can be omitted.

Figure 7:
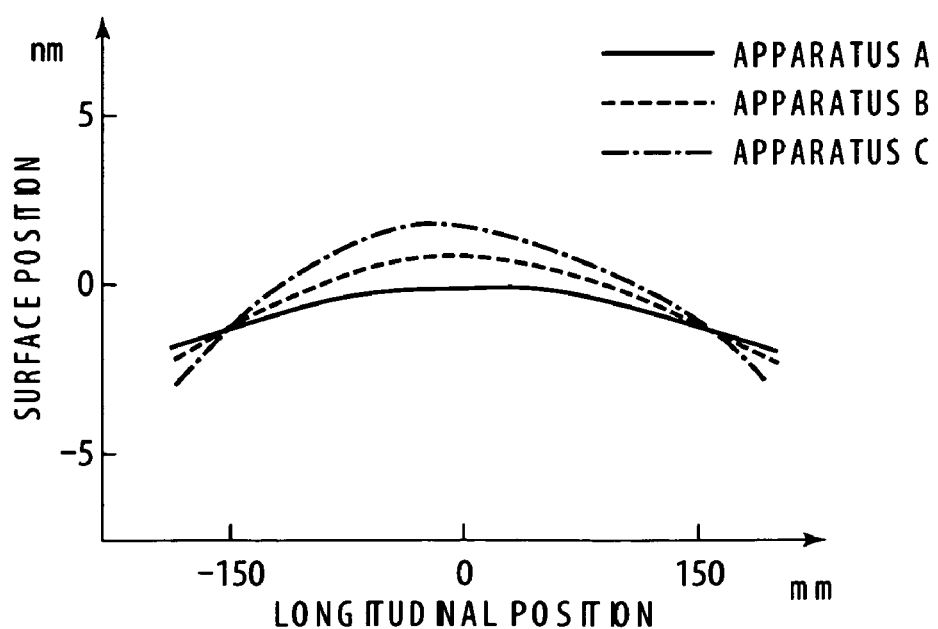
FIG. 7 is a view illustrating bending the mirror shape of apparatuses.

Moreover, in the semiconductor manufacturing process, a so-called mix-and-match method exposure is often applied, where superimposed exposure is performed by using a plurality of exposure apparatuses. In the case when a plurality of exposure apparatuses are used like this, it can be difficult to make the shapes of the mirrors identical in all apparatuses from the viewpoint of the machining accuracy, resulting in a difference between machines being created in the stage characteristics (FIG. 7) In FIG. 7, the abscissa shows the position in the mirror longitudinal direction (longitudinal position), and the ordinate shows the surface position in the direction perpendicular to the reflecting surface of the mirror (longitudinal position). However, when a standard exposure apparatus is selected and, using a wafer which is exposed by the standard exposure apparatus as a reference, the deformation control of the mirror for another exposure apparatus is carried out so that the latter exposure apparatus has similar stage characteristics, and can improve the accuracy in superimposed exposure.

Figure 3:
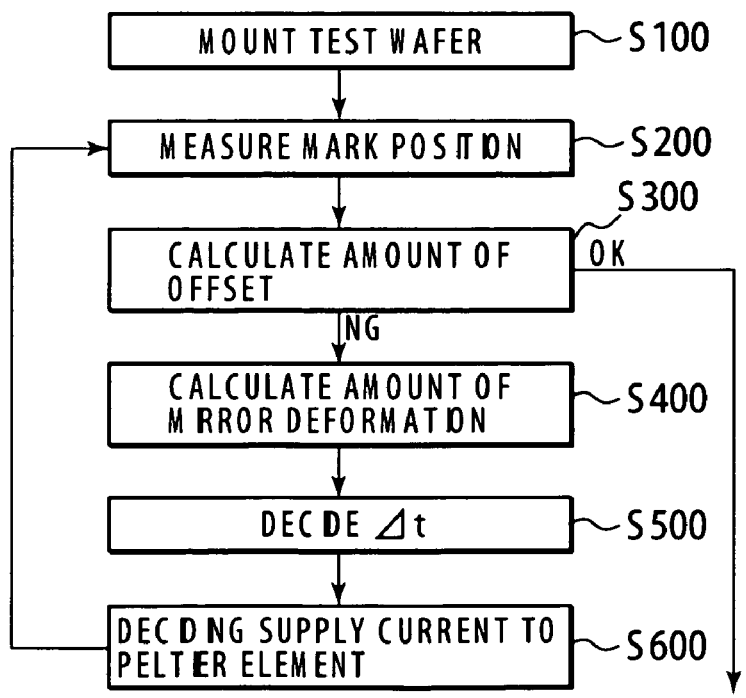
FIG. 3 is a flow chart of a mirror deformation control system.

Hereinafter, a correction method of the mirror shape by using the mix-and-match method will be explained. FIG. 3 is a flow chart for deformation control of the mirror. An exposure apparatus to become a standard is selected from a plurality of exposure apparatuses and, using a test wafer which is exposed by the standard exposure apparatus as a reference, the deformation control of the mirror for another exposure apparatus is carried out so that the latter exposure apparatus has similar stage characteristics. Hereinafter, the flow chart will be explained.

A wafer is mounted on the standard exposure apparatus. An arbitrary number of superposition marks are formed on the wafer while moving the stage in a predetermined direction (X or Y direction). The wafer as a test wafer is mounted on another exposure apparatus (hereinafter, called an object exposure apparatus) (step S100). The stage is moved in the predetermined direction (e.g., X or Y direction), in the same manner as that of the standard exposure apparatus, and the superposition superimposed marks on the wafer are detected by an alignment scope (step S200). Based on the detection result, the amount of offset of the superposition marks relative to the stage scan is calculated (e.g., an offset) (step S300). Based on this amount of offset, the amount of deformation required to the mirror for the object exposure apparatus is calculated (step S400). Based on this amount of deformation, the temperature change which should be given to the Peltier elements 4 is calculated (step S500) by the controller 7. Based on this temperature change and the relationship between a preliminarily obtained temperature change and current needed to energize the Peltier elements, the current is supplied to the Peltier elements (step S600).

According to performing such a deformation control of the mirror, the influence of the measurement error caused by a difference between machines of respective exposure apparatuses can be reduced.

The mirror can be attached separately on the stage but it can also be configured with the stage in a unit. Moreover, although the coarse movement stage and the fine movement stage are provided, it is not necessary for them to be provided independently, and the fine movement stage can also function as the coarse movement stage.

Exemplary Embodiment 2

Figure 5:
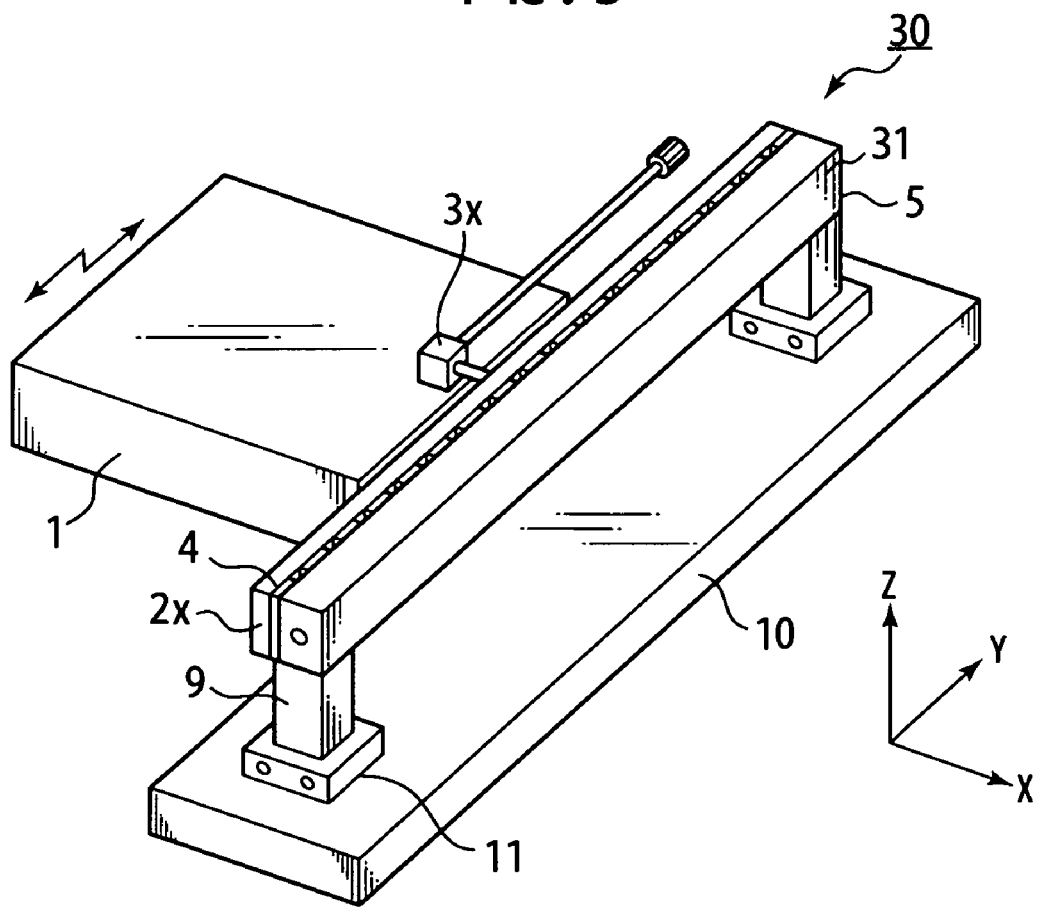
FIG. 5 is a schematic view illustrating a stage apparatus according to the second exemplary embodiment of the present invention.

FIG. 5 is a view for explaining the stage apparatus related to at least one exemplary embodiment 2 of the present invention.

In exemplary embodiment 2, the mirror is provided not on the fine movement stage but on the outside of the stage. The configuration of the driving mechanism of the stage is the same as that in exemplary embodiment 1, and the explanation thereof is omitted.

In FIG. 5, a laser interferometer 3X is provided on the fine movement stage 1. A mirror 2X is provided on a base 10 through a mirror support member (9 and 11). A temperature control mechanism 30 is provided on the mirror 2X. The temperature control mechanism 30 comprises a plurality of Peltier elements 4 arranged along the mirror and a member 31, which can have a flow channel 5 formed therein. A temperature-controlled coolant can be circulated in the flow channel 5 though a piping, which is not shown in the figure. The mirror support member can have support posts 9 and legs 11, and a flow channel provided in the legs 11. The effect of heat conducting from the base 10 to the mirror 2X can be suppressed by circulating the temperature-controlled coolant in this flow channel.

The base 10 is not intended to be limited to the base where the stage is installed, and one which can be a standard of measurement is acceptable and falls within at least one exemplary embodiment.

The method of controlling the shape of the mirror 2X is assumed to be the same as that in exemplary embodiment 1, and the explanation thereof is omitted. Moreover, although the mirror 2X is explained herein, a similar explanation can be given to mirrors 2Y and 2Z.

Exemplary Embodiment 3

Figure 6:
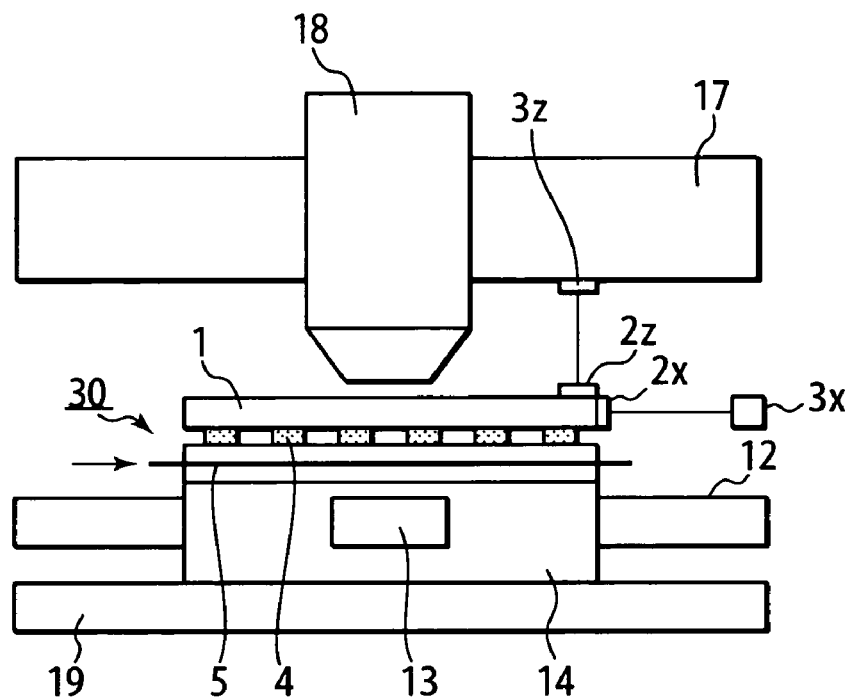
FIG. 6 is a schematic view illustrating a stage apparatus according to the third exemplary embodiment of the present invention.

FIG. 6 is a view illustrating a stage apparatus related to exemplary embodiment 3 of the present invention. The point in exemplary embodiment 3 which differs from exemplary embodiment 1 is that the Peltier elements are not arranged on the mirror and the temperature control mechanism is arranged at the rear face of the fine movement stage 1. This exemplary embodiment discussed at least one non limiting example, however other configurations are assumed to lie within the scope of at least one exemplary embodiment.

Distortion can be created in the fine movement stage due to the machining accuracy, the mounting accuracy, and its own weight. Deformation can be created in the mirror corresponding to such distortion of the fine movement stage 1, and it can be noticeable when the mirror and the fine movement stage have been integrated. Therefore, in this exemplary embodiment, there is an attempt to correct and/or reduce the deformation of the mirror by controlling the thermal deformation of the fine movement stage using Peltier element 4.

In FIG. 6, the temperature control mechanism 30 is provided on the rear face of the fine movement stage 1. The temperature control mechanism 30 has a plurality of Peltier elements 4 arranged along the rear face of the fine movement stage 1 and the member 31, which can have the flow channel 5 formed therein.

The mirrors 2X, 2Z are provided on the fine movement stage 1, the shape of the mirrors is calculated from the measurement values of the laser interferometers 3X, 3Z, and based on the calculated values, the current levels for energizing the Peltier elements are determined. Herein, the relationship between the current for energizing the Peltier elements and the shape of the mirrors is obtained in advance by experiments and simulations. As mentioned above, exemplary embodiments 1 to 3 comprise a mirror shape calculation device configured for calculating the shape of the mirror and, a temperature control device configured for controlling the temperature of the mirror based on the output of the mirror shape calculation device. That is, in at least one exemplary embodiment, the mirror is deformed by using the thermal deformation of the mirror in order to correct and/or reduce the measurement error.

In the case when the mirror is deformed by pressing a plurality of rods using the actuator, an unwanted deformation might be caused as a consequence of the shape of the rod tip.

However, there is no such problem in the case when the thermal deformation is used as in exemplary embodiments 1 to 3, and the influences of the measurement error can be effectively corrected and/or reduced. Moreover, in exemplary embodiments 1 to 3, the shape of the mirror is calculated by using the alignment marks formed on the test wafer. Therefore, the influence of the measurement error caused by the stage characteristics, that each of plurality of exposure apparatuses has, can be decreased. Deforming the mirror by using thermal deformation is discussed in at least one exemplary embodiment, however the exemplary embodiments are not intended to be limited to thermal deformation for the purpose of decreasing the influences of a difference between machines, for example, physical contact (e.g., a pressing member against the mirror) can also be used, and is intended to lie within the scope of at least one exemplary embodiment. That is, an actuator can be used. In an example of using an actuator, the mirror can be deformed by pressing a rod or rods on the surface of the mirror on the other side of the reflecting surface of the mirror. In this case, the actuator or actuators is used to actuate the rods. In another example of using an actuator, an electromagnetic actuator is provided on the surface of the mirror on the other side of the reflecting surface of the mirror.

Figure 8:
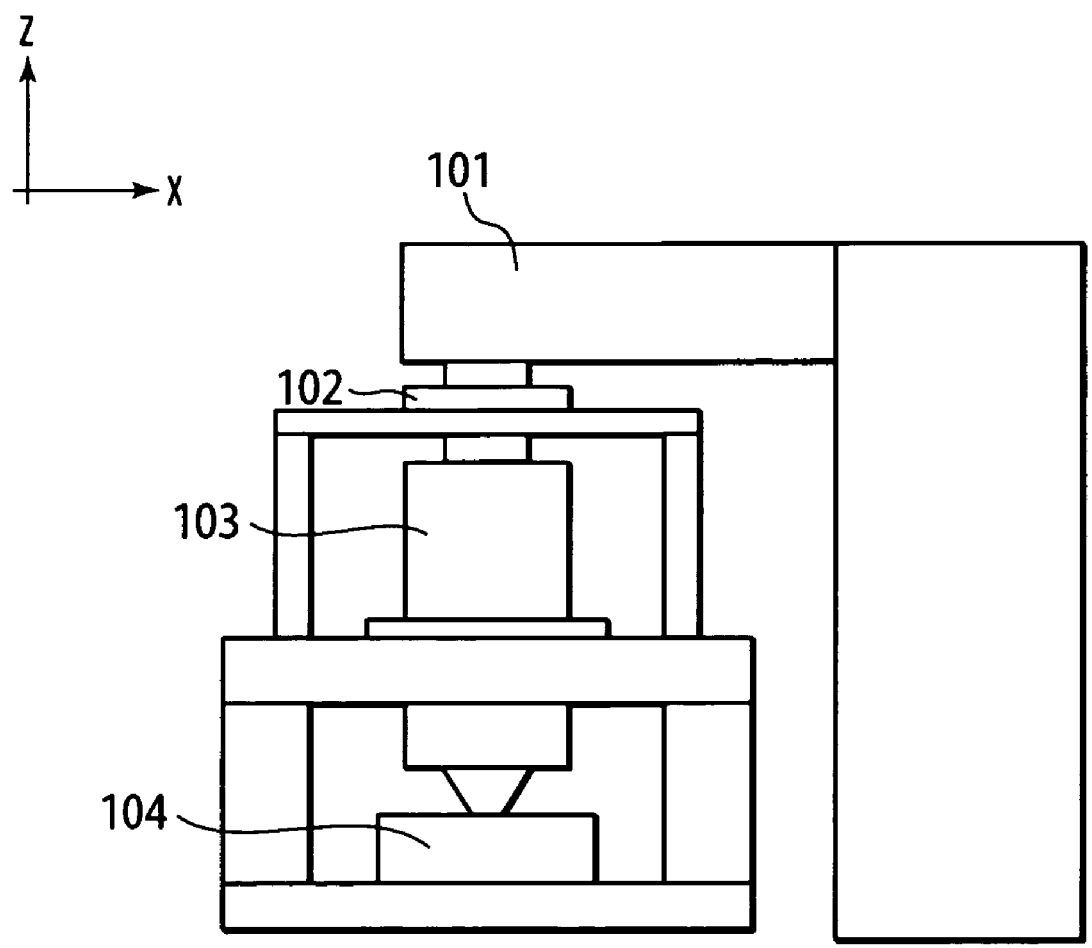
FIG. 8 is a schematic view for explaining an exposure apparatus.

<Example of exposure apparatus with stage apparatus>Hereinafter, illustrative exposure apparatus to which the stage apparatus in the exemplary embodiments 1 to 3 can be applied will be explained. As illustrated in FIG. 8, the exposure apparatus has an illuminator 101, a reticle stage 102 on which a reticle is mounted, an optical projection system 103, and a wafer stage 104 on which a wafer is mounted. The exposure apparatus is one where a circuit pattern formed on the reticle is projection-exposed on the wafer and can be of a step-and-repeat projection exposure type or a step-and-scan projection exposure type.

The illuminator 101 illuminates the reticle on which the circuit pattern is formed and has a light source and a lighting optical system. The light source part can vary for example the light source part can be a laser. Additional non limiting examples of a light source part are, an ArF excimer laser with a wavelength of about 193 nm, a KrF excimer laser with a wavelength of about 248 nm, and an F2 excimer laser with a wavelength of about 153 nm, a laser that is not limited to an excimer laser and, for instance, a YAG laser can be used. Additionally, the number of lasers used is not limited. In the case when a laser can be used for the lighting source, a luminous flux forming optical system in which a parallel optical flux from the laser source is formed into a desired beam shape and an incoherent optical system in which a coherent laser beam flux is made incoherent can be used. Moreover, the light source which can be used for the light source part is not limited to a laser and one or a plurality of lamps for example a mercury vapor lamp, a xenon lamp and other lamps as known by one of ordinary skill in the relevant arts and equivalents can be used.

A lighting optical system is an optical system for illuminating a mask and includes a lens, a mirror, a light integrator, and an aperture. An optical projection system 103, including an optical system can be used where for example the optical system can comprise a plurality of lens elements, or an optical system which can have a plurality of lens elements and at least one concave mirror element (e.g., Catadioptric optical system), or an optical system, which can have a plurality of lens elements and at least one diffraction optical element such as a kinoform, or an all-mirror type optical system.

The reticle stage 102 and the wafer stage 104 can be moved by, for instance, linear motors. In the case of the step-and-scan projection exposure type, respective stages move synchronously. Moreover, in order to adjust the pattern of the reticle on the wafer, an actuator is provided separately to at least either the wafer stage or the reticle stage.

The stage apparatus described in the exemplary embodiments 1 to 3 can be applied to at least either the above-mentioned wafer stage or the reticle stage and used for positioning the wafer or the reticle. Using such an exposure apparatus, can increase the accuracy of the exposure.

Exposure apparatus, in accordance with at least one exemplary embodiment, can be used for manufacturing a semiconductor device such as a semiconductor integrated circuit, a micro-machine, a device such as a thin film magnetic head, and other devices on which minute patterns are formed as known by one of ordinary skill and equivalents.

Figure 9:
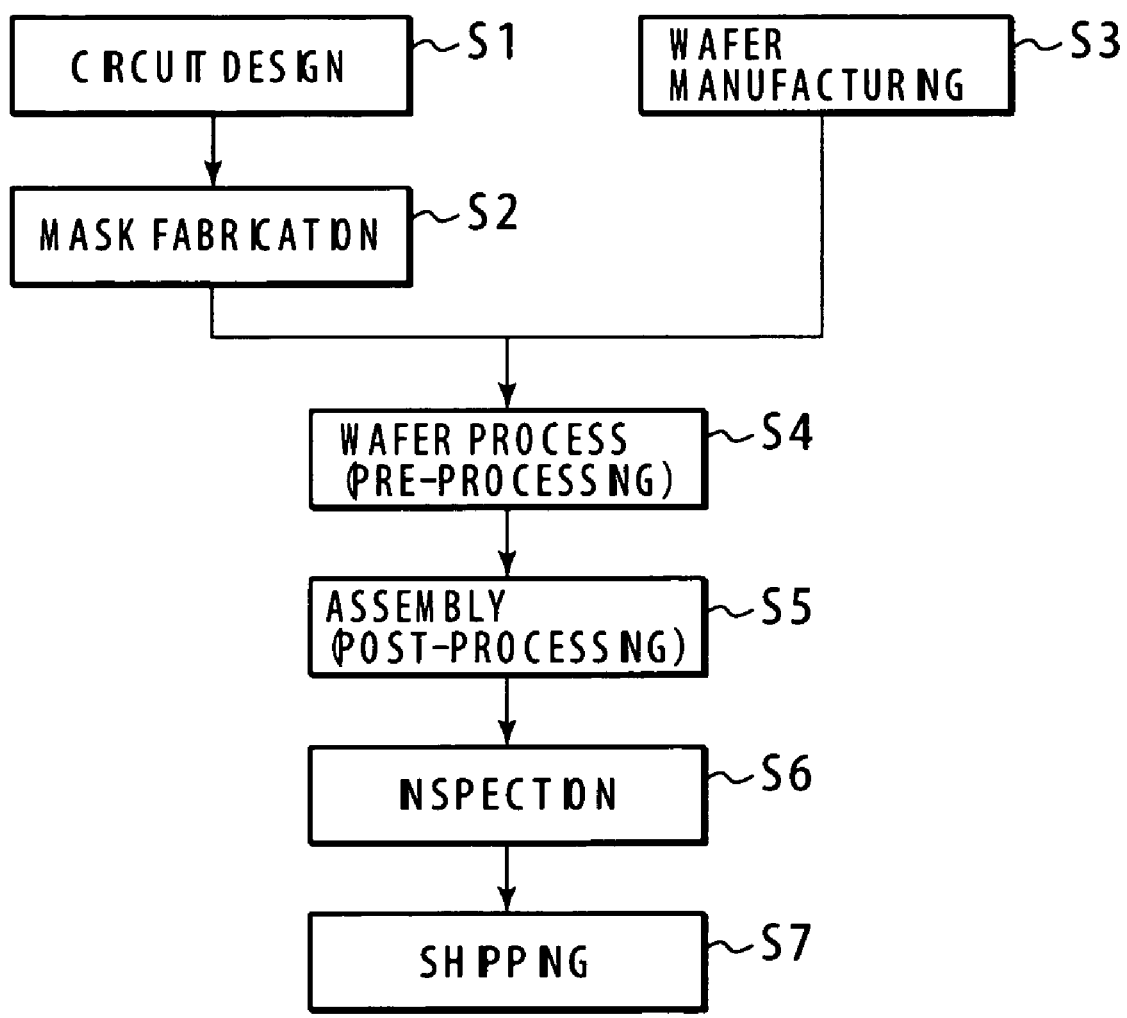
FIG. 9 is a flow chart for explaining the manufacturing of a device using an exposure apparatus.

Next, an example of a manufacturing method of a device using the above-mentioned exposure apparatus will be explained referring to FIGS. 9 and 10. FIG. 9 is a flow chart for explaining the manufacturing of a device (e.g., semiconductor chip such as IC and LSI, LCD, CCD, or other chip as known by one of ordinary skill in the relevant art and equivalents). Herein, a manufacturing method of a semiconductor chip will be explained as a non limiting example.

In step S1 (circuit design or designed circuit pattern), the circuit design of a semiconductor device is carried out. In step S2 (mask fabrication), a mask is fabricated based on the designed circuit pattern. In step S3 (wafer manufacturing), a wafer is manufactured by using a material such as silicon, or other semiconductive or conductive material as known by one of ordinary skill in eth relevant arts and equivalents. Step S4 (wafer process) is called pre-processing and an actual circuit is formed on the wafer by using the mask and the wafer, and using lithography technology with the above-mentioned exposure apparatus. Step S5 (assembly), which is the so-called post-processing, is a process for making it into a semiconductor chip by using the wafer fabricated in Step S4, and includes assembling processes such as an assembly process (dicing and bonding) and packaging processes (chip encapsulation). In step S6 (inspection), inspections such as the confirmation test for operation and the durability test are carried out for the semiconductor device fabricated in Step S5. The semiconductor device is completed through these steps and it is shipped (Step S7).

Figure 10:
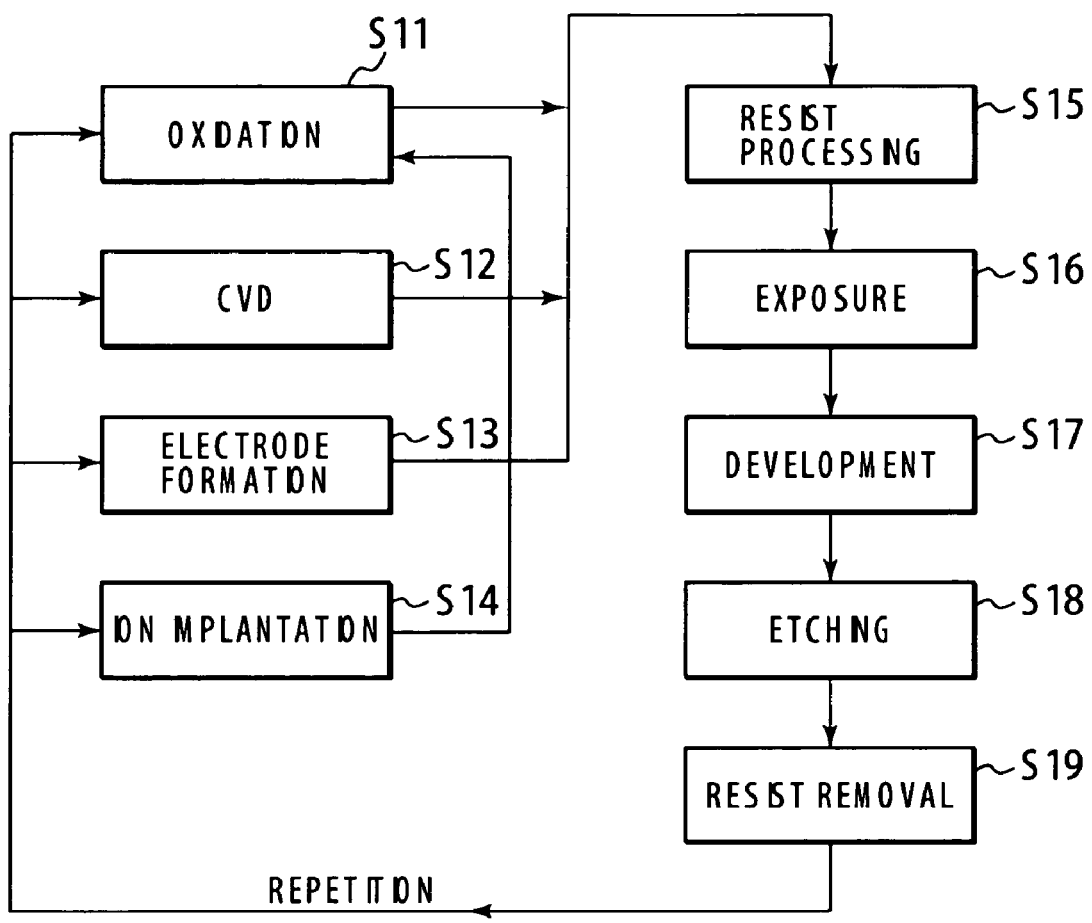
FIG. 10 is a detailed flow chart of a wafer process in the step 4 shown in FIG. 9.

FIG. 10 is a detailed flow chart of the wafer process of Step S4. In Step S11 (oxidation), the surface of the wafer is oxidized. In Step S12 (CVD), an insulation film is formed on the surface of the wafer. In step s13 (electrode formation), electrodes are formed on the wafer by vapor deposition. In Step S14 (ion implantation), ions are implanted into the wafer. In Step S15 (resist processing), a photosensitizer is coated on the wafer. In Step S16 (exposure), the circuit pattern of a mask is exposed to the wafer by using the exposure apparatus. In Step S17 (development), the exposed wafer is developed. In step S18 (etching), parts other than the developed resist image are removed. In step S19 (resist removal), the resist which is not needed once etching is finished is removed. The circuit patterns are formed on the wafer in multiples by repeating these steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application No. 2005-141030 filed May 13, 2005, which is hereby incorporated by reference herein in it's entirety.

What is claimed is:
1. A stage apparatus comprising:
a movable stage;
a mirror for reflecting light to measure a position of the stage;
a first Peltier element provided along the mirror;
a second Peltier element provided along the stage;
a heat exchanger for recovering heat radiated from the Peltier elements;
a calculator for calculating a shape of the mirror; and
a controller for controlling a current energizing the Peltier elements based on the shape of the mirror calculated by the calculator,
wherein the heat exchanger is provided between the stage and the mirror, and wherein the first Peltier element is provided on the mirror side in relation to the heat exchanger, and second Peltier element is provided on the stage side in relation to the heat exchanger.

2. The stage apparatus according to claim 1, wherein a memory which can store a preliminarily obtained relationship between the shape of the mirror and the current energizing the Peltier elements is provided, and the current energizing the Peltier elements is controlled based on the relationship.

3. The stage apparatus according to claim 1, wherein the current energizing the plurality of Peltier elements is independently controlled.

4. The stage apparatus according to claim 1, wherein the heat exchanger has a piping therein to make a coolant circulate and where the heat irradiated from the Peltier elements is recovered by controlling a temperature of the coolant.

5. An exposure apparatus comprising:
a light source configured to generate irradiating light for exposure; and
a projection unit for projecting a pattern of an original plate onto a substrate by using the light for exposure,
wherein positioning of at least one of the original plate and the substrate is carried out by using the stage apparatus according to claim 1.

6. The exposure apparatus according to claim 5, wherein the calculator calculates the shape of the mirror by detecting alignment marks formed on the substrate or the original plate.

7. A device manufacturing method comprising:
exposing a substrate by using the exposure apparatus according to claim 5; and
developing the substrate.

* * * * *